(12) United States Patent
Carcasi et al.

(10) Patent No.: US 12,123,778 B2
(45) Date of Patent: Oct. 22, 2024

(54) THERMAL IMAGING SENSOR FOR INTEGRATION INTO TRACK SYSTEM

(71) Applicant: Tokyo Electron Limited, Tokyo (JP)

(72) Inventors: Michael Carcasi, Austin, TX (US); Kazuhiro Shiba, Koshi (JP); Masahide Tadokoro, Koshi (JP); Masashi Enomoto, Koshi (JP); Toyohisa Tsuruda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 777 days.

(21) Appl. No.: 17/192,520

(22) Filed: Mar. 4, 2021

(65) Prior Publication Data
US 2021/0285822 A1    Sep. 16, 2021

Related U.S. Application Data

(60) Provisional application No. 62/987,782, filed on Mar. 10, 2020.

(51) Int. Cl.
*G01J 5/00* (2022.01)
*H04N 5/33* (2023.01)

(52) U.S. Cl.
CPC .............. *G01J 5/0007* (2013.01); *H04N 5/33* (2013.01); *G01J 2005/0077* (2013.01)

(58) Field of Classification Search
CPC ..... G01J 5/007; G01J 2005/0077; H04N 5/33
See application file for complete search history.

(56) References Cited

U.S. PATENT DOCUMENTS

| 4,647,172 A | 3/1987 | Batchelder et al. |
| 4,851,311 A | 7/1989 | Millis et al. |

(Continued)

FOREIGN PATENT DOCUMENTS

| JP | H04262552 A | 9/1992 |
| JP | H09276775 A | 10/1997 |

(Continued)

OTHER PUBLICATIONS

FLIR, Technical Note, "R&D and industrial applications for Near Infrared (NIR) cameras," Publicly Available at least as of Apr. 1, 2021, 4 pages.

(Continued)

*Primary Examiner* — Randy W Gibson
(74) *Attorney, Agent, or Firm* — Slater Matsil, LLP

(57) ABSTRACT

Various embodiments of systems and methods for monitoring thermal characteristics of substrates, substrate processes and/or substrate processing module components are disclosed herein. More specifically, the present disclosure provides various embodiments of a thermal imaging sensor within various substrate processing modules (e.g., a liquid dispense module, a baking module or combined bake module, an interface block, a wafer inspection system (WIS) module, a plating dispense module or another processing module) of a substrate processing system. By positioning the thermal imaging sensor at various locations within the substrate processing system, the present disclosure enables thermal data to be remotely collected from the substrate surface, a liquid dispensed onto the substrate surface, a processing space surrounding the substrate, or a component included within a substrate processing module (e.g., a liquid dispense nozzle, a spin chuck, a spin coat cup, a cooling arm, a WIS component, a heating component, etc.).

13 Claims, 7 Drawing Sheets

(56) References Cited

U.S. PATENT DOCUMENTS

| | | |
|---|---|---|
| 5,089,305 A | 2/1992 | Ushijima et al. |
| 5,094,884 A | 3/1992 | Hillman et al. |
| 5,127,362 A | 7/1992 | Watsu et al. |
| 5,152,175 A | 10/1992 | Reynolds |
| 5,366,757 A | 11/1994 | Lin |
| 5,939,130 A | 8/1999 | Shiraishi et al. |
| 5,985,357 A | 11/1999 | Sanada |
| 6,248,175 B1 | 6/2001 | Subramanian et al. |
| 6,319,317 B1 | 11/2001 | Takamori |
| 6,376,013 B1 | 4/2002 | Rangarajan et al. |
| 6,383,948 B1 | 5/2002 | Kitano et al. |
| 6,493,078 B1 | 12/2002 | Fitzsimmons et al. |
| 6,642,155 B1 | 11/2003 | Whitman et al. |
| 6,680,078 B2 | 1/2004 | Davlin et al. |
| 6,686,602 B2 | 2/2004 | Some |
| 6,693,708 B1 | 2/2004 | Hunter |
| 6,707,545 B1 | 3/2004 | Hunter |
| 6,710,868 B2 | 3/2004 | Guetta |
| 6,721,045 B1 | 4/2004 | Hunter |
| 6,818,064 B2 | 11/2004 | Baker |
| 6,849,563 B2 | 2/2005 | Barth et al. |
| 6,869,640 B2 | 3/2005 | Yoshihara et al. |
| 6,913,781 B2 | 7/2005 | Kaneyama et al. |
| 6,982,002 B2 | 1/2006 | Tanaka et al. |
| 7,012,684 B1 | 3/2006 | Hunter |
| 7,485,188 B2 | 2/2009 | Takekuma et al. |
| 7,497,026 B2 | 3/2009 | Herchen et al. |
| 7,659,973 B2 | 2/2010 | Furman |
| 7,670,643 B2 | 3/2010 | Winter |
| 8,254,657 B2 | 8/2012 | Pollack et al. |
| 9,555,436 B2 | 1/2017 | Uemae et al. |
| 9,709,510 B2 | 7/2017 | Kolchin |
| 10,109,508 B2 | 10/2018 | Ashidate et al. |
| 10,508,953 B2 * | 12/2019 | Yang .............. G01J 5/0037 |
| 10,665,481 B2 | 5/2020 | Sano et al. |
| 11,056,358 B2 * | 7/2021 | Huang ............. H01L 21/6875 |
| 2002/0176928 A1 | 11/2002 | Minami et al. |
| 2003/0008066 A1 | 1/2003 | Yoshihara et al. |
| 2003/0218741 A1 | 11/2003 | Guetta |
| 2004/0072450 A1 | 4/2004 | Collins et al. |
| 2005/0263066 A1 | 12/2005 | Lubomirsky et al. |
| 2006/0262295 A1 | 11/2006 | Backhauss et al. |
| 2007/0251450 A1 | 11/2007 | Lin |
| 2007/0290047 A1 | 12/2007 | Tazaki et al. |
| 2008/0143828 A1 | 6/2008 | Mandrachia et al. |
| 2008/0144025 A1 | 6/2008 | Vollrath |
| 2010/0091284 A1 | 4/2010 | Mieher et al. |
| 2010/0265988 A1 * | 10/2010 | Newman .............. G01K 13/00 374/E11.018 |
| 2013/0010296 A1 | 1/2013 | Kwak et al. |
| 2013/0312788 A1 | 11/2013 | Kubo et al. |
| 2014/0045281 A1 | 2/2014 | Aiura et al. |
| 2015/0029517 A1 | 1/2015 | Park et al. |
| 2015/0131698 A1 * | 5/2015 | Vellore ................ G01J 5/03 392/411 |
| 2015/0197861 A1 | 7/2015 | Tice et al. |
| 2015/0219499 A1 * | 8/2015 | Waldmann ............. G01J 5/02 374/1 |
| 2015/0246175 A1 | 9/2015 | Shubinsky et al. |
| 2015/0346609 A1 | 12/2015 | Den Boef |
| 2015/0362367 A1 | 12/2015 | Seo et al. |
| 2016/0327777 A1 | 11/2016 | Rowlette et al. |
| 2017/0003171 A1 * | 1/2017 | Wada ................. G01J 5/0007 |
| 2017/0309501 A1 | 10/2017 | Kitamura et al. |
| 2018/0082862 A1 | 3/2018 | Ashidate et al. |
| 2018/0128676 A1 | 5/2018 | Katzlinger et al. |
| 2018/0161828 A1 * | 6/2018 | Yang ................ H01L 21/67253 |
| 2018/0233383 A1 | 8/2018 | Ashidate et al. |
| 2018/0233384 A1 | 8/2018 | Nagai et al. |
| 2018/0307206 A1 * | 10/2018 | Atherton ............ G05B 19/4099 |
| 2018/0323085 A1 | 11/2018 | Sano et al. |
| 2019/0103294 A1 | 4/2019 | Masutomi et al. |
| 2019/0172737 A1 | 6/2019 | Endo et al. |
| 2019/0217325 A1 | 7/2019 | deVilliers |
| 2019/0217326 A1 | 7/2019 | deVilliers |
| 2019/0287793 A1 | 9/2019 | deVilliers et al. |
| 2020/0098598 A1 | 3/2020 | Takahashi et al. |
| 2020/0194280 A1 | 6/2020 | Konishi et al. |
| 2020/0234428 A1 | 7/2020 | George et al. |
| 2020/0381278 A1 * | 12/2020 | Vellore .............. H04N 5/33 |
| 2021/0057245 A1 * | 2/2021 | Ueno ............. H01L 21/67248 |
| 2021/0129166 A1 | 5/2021 | Carcasi et al. |
| 2021/0134637 A1 | 5/2021 | Carcasi et al. |
| 2021/0150697 A1 | 5/2021 | Estrella et al. |
| 2021/0272827 A1 * | 9/2021 | Nakajima ........... G01J 5/0007 |
| 2021/0278280 A1 * | 9/2021 | Lee .................. G01J 5/0037 |
| 2021/0285822 A1 * | 9/2021 | Carcasi ............ H01L 21/6715 |
| 2022/0068673 A1 | 3/2022 | Nakaoka et al. |
| 2022/0252992 A1 * | 8/2022 | Tadokoro ............. G03F 7/16 |
| 2022/0390175 A1 * | 12/2022 | Tobe .................. G01J 5/802 |
| 2023/0274959 A1 * | 8/2023 | Kitazawa ............ G01J 5/0007 374/121 |
| 2023/0326823 A1 * | 10/2023 | Arens ................ G01J 5/0007 374/208 |

FOREIGN PATENT DOCUMENTS

| | | |
|---|---|---|
| JP | 2000082646 A | 3/2000 |
| JP | 2006049630 A | 2/2006 |
| JP | 2006339598 A | 12/2006 |
| JP | 2009094208 A | 4/2009 |
| JP | 2013110270 A | 6/2013 |
| JP | 2013247183 A | 12/2013 |
| JP | 5431172 B2 | 3/2014 |
| JP | 6000743 B2 | 10/2016 |
| JP | 6020829 B2 | 11/2016 |
| JP | 2017508136 A | 3/2017 |
| JP | 2017090232 A | 5/2017 |
| JP | 2018046262 A | 3/2018 |
| JP | 2019102742 A | 6/2019 |
| KR | 200287420 Y1 | 8/2002 |
| KR | 100989857 B1 | 10/2010 |
| KR | 101107507 B1 | 1/2012 |
| KR | 20160112240 A | 9/2016 |
| KR | 20170022512 A | 3/2017 |
| KR | 101842119 B1 | 3/2018 |
| KR | 101977771 B1 | 5/2019 |
| TW | 201944486 A | 11/2019 |
| WO | 229390 A2 | 4/2002 |
| WO | 0231866 A2 | 4/2002 |
| WO | 2015195746 A1 | 12/2015 |
| WO | 2016084927 A1 | 6/2016 |

OTHER PUBLICATIONS

PCT International Search Report and Written Opinion, PCT application No. PCT/US2021/020577, issued Jun. 21, 2021, 13 pages.
FLIR Systems Lepton series LWIR camera specification sheet Mar. 2021, 2 pages.
M. Barth, et al., "A color vision system for microelectronics: Application to oxide thickness measurements," Proceedings. 1986 IEEE International Conference on Robotics and Automation, San Francisco, CA, USA, 1986, pp. 1242-1247.
PCT International Search Report and Written Opinion, PCT Application No. PCT/US2022/027865, mailed Sep. 1, 2022, 11 pages.

\* cited by examiner

THERMAL IMAGING SENSOR FOR INTEGRATION INTO TRACK SYSTEM

CROSS-REFERENCE TO RELATED APPLICATIONS

This application claims the benefit of U.S. Provisional Application No. 62/987,782 filed on Mar. 10, 2020, which application is hereby incorporated herein by reference.

TECHNICAL FIELD

The present disclosure relates to the processing of substrates. in particular, the present application relates to thermal imaging sensor for integration into track system.

BACKGROUND

Traditional substrate processing systems utilize photolithography processes, which include coating, exposure, develop and bake steps. The materials and processes utilized in these steps may all impact film thickness, critical dimension targeting, line roughness, uniformity, etc. on a substrate. As geometries in substrate processing continue to shrink, the technical challenges to forming structures on substrates increase.

There are many processes and steps that exist within substrate processing systems, which could benefit from real time temperature monitoring of the substrate, the temperature of chemicals being dispensed on the substrate (in one example a wafer), or the effects of chemical reactions happening on the substrate. In conventional substrate processing systems, thermal monitoring has historically made use of contact probes, such as for example, thermocouples. Unfortunately, contact based thermal monitoring probes limit the extent of thermal monitoring that can be used within substrate processing systems.

Infrared thermography, or thermal imaging, has been employed in other fields (e.g., surveillance, building construction/inspection, etc.) to remotely determine the temperature of objects by monitoring infrared radiation emitted from the objects. Thermal imaging sensors, typically covering the 8~15 um wavelength region, can obtain a completely passive thermal image of objects only slightly higher in temperature than room temperature, based solely on thermal emissions and without requiring illumination. It would, therefore, be desirable to incorporate thermal imagining sensors within a substrate processing system to provide remote, thermal monitoring of substrates, substrate processes and substrate processing module components.

SUMMARY

Various embodiments of systems and methods for monitoring thermal characteristics of substrates, substrate processes and/or substrate processing module components are disclosed herein. More specifically, the present disclosure provides various embodiments of a thermal imaging sensor within various substrate processing modules (e.g., a liquid dispense module, a baking module or combined bake module, an interface block, a wafer inspection system (WIS) module, a plating dispense module or another processing module) of a substrate processing system. By positioning the thermal imaging sensor at various locations within the substrate processing system, the present disclosure enables thermal data to be remotely collected from the substrate surface, a liquid dispensed onto the substrate surface, a processing space surrounding the substrate, or a component included within a substrate processing module (e.g., a liquid dispense nozzle, a spin chuck, a spin coat cup, a cooling arm, a WIS component, a heating component, etc.).

According to one embodiment, a system provided herein may generally comprise at least one processing module for processing a substrate; a thermal imaging sensor positioned within the at least one processing module to obtain thermal data from the substrate, a liquid dispensed onto the substrate, or a component included within the at least one processing module; and a controller coupled to receive the thermal data from the thermal imaging sensor and configured to process the thermal data for fault detection monitoring, process control, substrate evaluation, equipment evaluation, process evaluation, or end-of-life prediction.

In one alternative embodiment, the system may be further described wherein the at least one processing module is a liquid dispense module, and wherein the thermal imaging sensor is positioned on or near a ceiling of the liquid dispense module, such that a field of view (FOV) of the thermal imaging sensor encompasses the substrate and/or one or more surrounding components.

In another alternative embodiment, the system may be further described wherein the at least one processing module is a liquid dispense module, and wherein the thermal imaging sensor is mounted onto a nozzle scan arm included within the liquid dispense module, or a sidewall of the liquid dispense module, so that a field of view (FOV) of the thermal imaging sensor encompasses a nozzle and/or a liquid dispensed by the nozzle.

In another alternative embodiment, the system may be further described wherein the at least one processing module is a bake module comprising a bake chamber, and wherein the thermal imaging sensor is positioned on or near a ceiling of the bake module, so that a field of view (FOV) of the thermal imaging sensor encompasses a cooling arm, which is configured to retrieve the substrate from the bake chamber and transport the substrate to a cooling chamber.

In another alternative embodiment, the system may be further described wherein the at least one processing module is an interface block (IFB).

In another alternative embodiment, the system may be further described wherein the at least one processing module is a wafer inspection (WIS) module comprising a camera system for obtaining images of the substrate during an inspection process, and wherein the thermal imaging sensor is positioned on a ceiling or a sidewall of the WIS module, so that a field of view (FOV) of the thermal imaging sensor encompasses the camera system and/or the substrate.

In another alternative embodiment, the system may be further described wherein the at least one processing module comprises a thermal grid planar to an upper surface of the substrate, and wherein the thermal imaging sensor is positioned on a ceiling of the at least one processing module and centered above the substrate.

In another alternative embodiment, the system may be further described wherein the at least one processing module comprises a plating dispense module comprising a plating chemical dispense assembly and a heater, and wherein the thermal imaging sensor is positioned within the plating dispense module, so that a field of view (FOV) of the thermal imaging sensor encompasses the plating chemical dispense assembly, the heater and/or the substrate.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

The present disclosure relates to the processing of substrates. In particular, it provides various embodiments of systems and methods for monitoring thermal characteristics of substrates, substrate processes and/or substrate processing module components. In one embodiment, the systems and methods disclosed herein may be utilized when processing semiconductor substrates.

DETAILED DESCRIPTION OF ILLUSTRATIVE EMBODIMENTS

Figure 1:
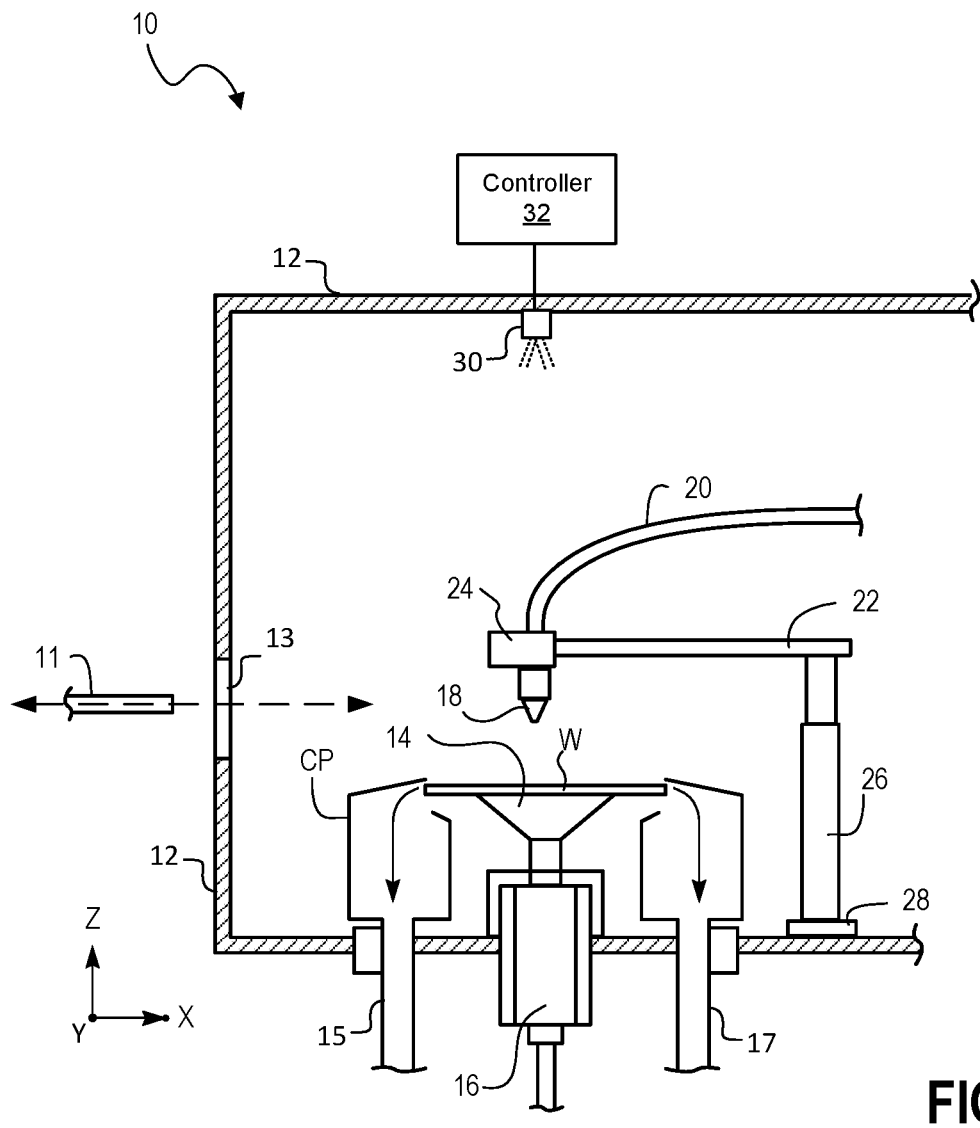
FIG. 1 is a side view of a liquid dispense module in which a thermal imaging sensor is included to monitor a temperature of a substrate disposed within the liquid dispense module, a process step or chemical reaction occurring within the liquid dispense module, or a component included within the liquid dispense module.

Various embodiments of systems and methods for monitoring thermal characteristics of substrates, substrate processes and/or substrate processing module components are disclosed herein. More specifically, the present disclosure provides various embodiments of a thermal imaging sensor within various substrate processing modules (e.g., a liquid dispense module, a baking module or combined bake module, an interface block, a WIS module, a plating dispense module or another processing module) of a substrate processing system. By positioning the thermal imaging sensor at various locations within the substrate processing system, the present disclosure enables thermal data to be remotely collected from the substrate surface, a liquid dispensed onto the substrate surface, a processing space surrounding the substrate, or a component included within a substrate processing module (e.g., a liquid dispense nozzle, a spin chuck, a spin coat cup, a cooling arm, a WIS component, a heating component, etc.).

Unlike conventional substrate processing systems, which use contact-based temperature sensing (e.g., thermocouples), the present disclosure provides a thermal imaging sensor within various substrate processing modules (e.g., a liquid dispense module, a baking module or combined bake module, an interface block, a WIS module, a plating dispense module or another processing module) of a substrate processing system. By positioning the thermal imaging sensor at various locations within the substrate processing system, the present disclosure enables thermal data to be remotely collected from the substrate surface, a liquid dispensed onto the substrate surface, a processing space surrounding the substrate, or a component included within a substrate processing module (e.g., a liquid dispense nozzle, a spin chuck, a spin coat cup, a cooling arm, a WIS component, a heating component, etc.).

Substrates, in one exemplary embodiment semiconductor wafers, are generally formed to include a base layer of silicon. Silicon has large transmission of wavelengths associated with long wavelength infrared (LWIR). In addition, the liquids dispensed and/or the additive layers introduced in various substrate processing modules have absorbance and emission properties in the wavelengths associated with LWIR. As a consequence, a LWIR sensor (or camera) can be used for thermal monitoring of substrates (or wafers) and processes performed on product wafers.

In some implementations, a thermal imaging sensor suitable for use with the substrate processing modules disclosed herein may include a LWIR sensor having a spectral range of approximately 8~14 um. One example of a suitable LWIR sensor is the LWIR micro thermal camera module provided by FLIR Systems, Inc. known as Lepton. The FLIR Lepton module is a LWIR camera that provides non-contact temperature data in every pixel of the 2D thermal image. Given the small form factor (approx. 10×12×7 mm), the LWIR camera can easily be incorporated into a variety of a substrate processing modules. It is noted, however, that the thermal imaging sensor disclosed herein is not limited to an LWIR camera and may be alternatively implemented in other embodiments.

The thermal data collected by the thermal imaging sensor may be supplied to various controllers for controlling one or more components included within a substrate processing module, and/or one or more substrate processing steps performed within a substrate processing module. For example, thermal data may be supplied to various controllers used for fault detection monitoring, feedback and/or feedforward process control, component end-of-life monitoring and/or calibration.

It is recognized that the thermal monitoring techniques described herein may be utilized within a wide variety of substrate processing modules and/or systems. Example substrate processing modules in which the thermal monitoring techniques described herein may be performed are shown in FIGS. 1-3 and 5-7. It will be recognized that the concepts, may however, be utilized in other substrate processing modules.

In some embodiments (see, FIGS. 1-2), a thermal imaging sensor may be incorporated within a liquid dispense module (such as, e.g., a coating module, a developing module, a back side scrubber module, etc.) to monitor a temperature of the substrate surface, a liquid applied to the substrate surface, or a component included within the liquid dispense module (e.g., a liquid dispense nozzle, a spin chuck, a spin coat cup, etc.). In other embodiments (see, FIG. 3), a thermal imaging sensor may be incorporated within a bake module (or a combined bake module) to monitor a temperature of component contained therein (such as, e.g., a cooling arm used to transfer substrates from a bake chamber to a cooling chamber). In yet other embodiments (see, FIG. 5), a thermal imaging sensor may be provided within an interface block (IFB) or interface section, which is used to transfer substrates between substrate process modules. In further embodiments (see, FIG. 6), a thermal imaging sensor may be provided within a wafer inspection system (WIS) module to monitor a temperature of one or more WIS module components (such as, e.g., a lamp, camera or other component). In yet further embodiments, a thermal imaging sensor may be incorporated within a plating dispense module to monitor a temperature of a dispensed plating chemical, a substrate temperature change induced by the dispensed plating chemical, an in-situ heater, or a substrate temperature change induced by the in-situ heater. In one embodiment, the plating dispense module may be an electroless plating module.

It is recognized that the substrate processing modules shown and described herein are merely exemplary embodiments of modules within which the thermal monitoring techniques described herein may be applied. Thus, the thermal monitoring techniques disclosed herein may be applied to other embodiments of liquid dispense modules, bake modules, interface blocks, WIS modules, plating dispense modules (for example electroless modules) and/or other types of substrate processing modules. It is noted that the substrate processing modules shown and described herein may be stand-alone units, or may be integrated in a larger substrate processing system. For example, one or more of the substrate processing modules shown and described herein may be integrated within a larger substrate processing system that includes coating, exposure, developing, baking, plating, inspection, etc. modules.

First Embodiment—a Thermal Imaging Sensor Incorporated within a Liquid Dispense Module FIG. 1 illustrates an exemplary liquid dispense module 10 (e.g., a coating module, a developing module, a spin coating module, etc.) within which liquids are applied to a substrate for processing purposes. It is recognized that the liquid dispense module 10 shown in FIG. 1 is merely one example of a substrate processing module within which the thermal monitoring techniques described herein may be applied. Thus, the techniques disclosed herein may be applied to other liquid dispense modules and/or other processing units.

Substrates are coated with various processing liquids in liquid dispense module 10. As shown in FIG. 1, liquid dispense module 10 includes a processing chamber, which is bounded by a chamber wall 12. A spin chuck 14 disposed inside chamber wall 12 provides support for a substrate, which may in some embodiments, be a semiconductor wafer (W). More specifically, the spin chuck 14 has a horizontal upper surface on which the substrate is supported during processing. A suction port (not shown) may be provided in the horizontal upper surface of spin chuck 14 for securing the substrate to the spin chuck with suction. The spin chuck 14, and the substrate supported by the spin chuck 14, may be rotated at a variable angular velocity by a drive mechanism 16, which may be a stepper motor, etc. The drive mechanism 16 may operate at various angular velocities for the application of the liquid material and flow of the liquid material onto the substrate.

A nozzle 18 is adapted to dispense one or more liquids onto the substrate at a specified rate to apply one or more layers or films onto an upper surface of the substrate. Typical layers or films that may be applied to the substrate surface include, but are not limited to, topcoat (TC) barrier layers, topcoat antireflective (TARC) layers, bottom antireflective (BARC) layers, imaging layers (e.g., photoresist) and sacrificial and barrier layers (hard mask) for etch stopping. The nozzle 18 is coupled to a liquid supply unit (not shown) through a liquid supply line 20. In some embodiments, nozzle 18 may be attached to the leading end of a nozzle scan arm 22 through a nozzle holder. The nozzle scan arm 22 may be mounted at the upper end portion of a vertical support member 26 that is horizontally movable on a guide rail 28 in one direction (e.g., in the Y-direction). Although not shown in FIG. 1, a drive mechanism (not shown) may be coupled to the nozzle scan arm 22, the vertical support member 26 or the guide rail 28 to move the nozzle 18 in the Y-direction. Other mechanisms (also not shown) can be used to move the nozzle 18 in the Z-direction and/or in the X-direction.

A cup (CP) is provided to capture and collect a majority of the liquid material ejected from the substrate by centrifugal forces generated during rotation by the spin chuck 14. The spin chuck 14 supports and rotates (i.e., spins) the substrate about its central normal axis relative to the cup, which is stationary. Liquid material ejected from the substrate and collected by the cup is drained via a drain line 15 and drain unit (not shown). In some embodiments, an exhaust line 17 and exhaust unit (not shown), such as a vacuum pump or other negative pressure-generating device, may also be used to removes gaseous species (including but not limited to vapors released from substrate layers during processing) from the processing space inside the cup.

Spin chuck 14 and drive mechanism 16 are disposed within an opening in the cup (CP). As shown in FIG. 1, a substrate can be delivered to the spin chuck 14 by a processing arm 11, which may be used to transfer substrates into/out of the liquid dispense module 10. In some embodiments, an elevation mechanism, such as an air cylinder and an up-and-down guide unit, can be used to lift the drive mechanism 16 and/or the spin chuck 14 upwards to receive a substrate delivered by the processing arm 11. Alternatively, the cup (CP) may be configured to move up-and-down, or may be configured to separate and widen, to allow a substrate to be placed on the spin chuck 14.

In the embodiment shown in FIG. 1, a thermal imaging sensor 30 is incorporated with liquid dispense module 10 to monitor a temperature of the substrate, a liquid dispensed onto the substrate, or a component included within the liquid dispense module (e.g., spin chuck 14, cup (CP), nozzle 18, etc.). In some embodiments, the thermal imaging sensor 30 may be coupled to the ceiling of the liquid dispense module 10 (as shown in FIG. 1), or near the ceiling on a sidewall of the liquid dispense module 10, so that a field of view (FOV) of the thermal imaging sensor 30 encompasses the substrate and/or surrounding components (e.g., spin chuck 14, cup (CP), nozzle 18, etc.).

As shown in FIG. 1, the thermal data collected by the thermal imaging sensor 30 is provided to a controller 32 for further processing. It is recognized that a variety of different controllers could be used to implement controller 32, depending on application. In some applications, controller 32 may process the thermal data collected by thermal imaging sensor 30 and use the processed data for fault detection monitoring. In other embodiments, controller 32 may use the processed data as an input variable for feedback and/or feedforward process control. In yet other embodiments, the processed data generated by controller 32 may be used to monitor or predict the end-of-life of a process module component. Depending on application, the embodiment shown in FIG. 1 may be applied to coating modules, develop modules, back side scrubber modules and/or any combination thereof.

In a first application of the embodiment shown in FIG. 1, the thermal imaging sensor 30 may be used in a coating module to monitor evaporative cooling effects of solvents applied to a substrate (e.g., a wafer) as a means to determine coat endpoint and/or to ensure a consistent coat evaporation history. As solvents evaporate (e.g., from a resist film applied to the wafer), the heat needed to induce the evaporation induces an evaporative cooling effect on the wafer (and the film). By positioning the thermal imaging sensor 30, such that the FOV of the sensor encompasses the wafer surface, the evaporative cooling effect provided by solvent evaporation from a coated wafer can be monitored.

In the first application of the embodiment shown in FIG. 1, the thermal imaging sensor 30 collects thermal data from the wafer surface, and the controller 32 processes the thermal data to monitor the evaporative cooling effect of solvent evaporation from the wafer surface. In some cases, controller 32 may process the thermal data to detect wafer-to-wafer evaporative cooling differences, which can be flagged by fault detection controls. In other cases, controller 32 may process the thermal data to detect module-to-module evaporative cooling differences, which can be used to adjust or optimize processing parameters (e.g., air flow, exhaust, chemical temperature, etc.) for module-to-module matching/repeatability. In yet other cases, controller 32 may process the thermal data to detect a metric associated with the end of the evaporative cooling thermal history (e.g., the wafer temperature begins to trend back towards ambient temperature of module). This metric can be used as a process end point metric, which can be used by another (e.g., a film thickness controller) as a way to proceed to the next step of the process recipe consistently from wafer to wafer. As described above, the thermal data relates to the wafer surface. However, bare silicon has a high transmission of LWIR light. Thus, depending upon the specific wafer (wafer thickness, amount, types and thicknesses of layers formed on the wafer, etc.), emissions may also be related to materials below the wafer surface (for example a backside chemical temperature and/or a vacuum chuck changing temperature due to spinning dynamics).

In a second application of the embodiment shown in FIG. 1, the thermal imaging sensor 30 may be used in a coating module or a develop module to monitor the temperature of a liquid (e.g. reducing resist consumption, edge bead removal, resist, develop, etc. solutions) dispensed onto a wafer and/or the wafer temperature changes induced by the dispensed liquid. While some dispensed liquids are thermally controlled and thermally monitored in conventional processing systems, it is not always clear how the wafer is affected by the thermal mass of the liquid dispensed onto the wafer surface, regardless of temperature control. Furthermore, since not all liquids are dispensed in the center of the wafer, it is hard to predict the local temperature impact that dispensed liquids have on the wafer surface, regardless of the volume dispensed. However, by positioning the thermal imaging sensor 30 so that the sensor FOV encompasses the wafer surface, the across wafer temperature impact of dispensed liquids can be monitored for fault detection purposes and/or for wafer-to-wafer and within wafer process control.

In the second application of the embodiment shown in FIG. 1, the thermal imaging sensor 30 collects thermal data from the wafer surface, and the controller 32 processes the thermal data to monitor the temperature of a liquid dispensed onto the wafer or a temperature change induced on the wafer by the dispensed liquid. In some cases, controller 32 may process the thermal data to determine an average temperature of the dispensed liquid, or an average wafer temperature change induced by the dispensed liquid. In some cases, a film thickness (FT) average controller (for a coat process) or a critical dimension (CD) average controller (for a develop process) may use the average temperature of the dispensed liquid, or the average wafer temperature change induced by the dispensed liquid, as an input variable for feedback or feedforward process control.

In other cases, controller 32 may process the thermal data to determine an across wafer temperature difference of the dispensed liquid, or an across wafer temperature difference induced by the dispensed liquid. In some cases, an FT uniformity controller (for a coat process) or a CD uniformity controller (for a develop process) may use the across wafer temperature difference of the dispensed liquid, or the across wafer temperature difference induced by the dispensed liquid, as an input variable for feedback or feedforward process control. For example, the input variable could be used to alter a number of potential control knobs to mitigate the effect of across wafer differences in the dispensed liquid temperature, or across wafer temperature differences induced by the dispensed liquids.

In other cases, the thermal data processed by controller 32 could be used for fault detection monitoring. Fault detection monitoring could include, but is not limited to, early diagnosis of thermal controller drifts/failures and poor/incomplete puddle formation detection (particularly in develop processing). For example, incomplete puddle formation may show up as a discernable thermal difference between the puddle's covered substrate area (temperature of the puddle) versus the areas without puddle coverage (temperature of the underlying substrate).

In a third application of the embodiment shown in FIG. 1, the thermal imaging sensor 30 may be used in a coating module or a develop module to monitor the temperature of the spin chuck 14 (and/or drive mechanism 16). While the drive mechanism 16 is thermally controlled and thermally monitored in conventional processing systems, the nature of the connection between the spin motor included within the drive mechanism 16 and the spin chuck 14 leads to a latency in the thermal control and thermal monitoring of the spin chuck 14. In high volume manufacturing, this thermal control latency means there is typically a thermal difference of spin chuck temperature through lot processing, especially when starting from a prolonged idle condition. However, by positioning the thermal imaging sensor 30, such that the FOV of the sensor encompasses the spin chuck 14, the temperature of the spin chuck 14 (and/or drive mechanism 16) can be monitored for fault detection monitoring and/or process control.

In the third application of the embodiment shown in FIG. 1, the thermal imaging sensor 30 collects thermal data from the spin chuck 14 (e.g., right before wafer delivery), and the controller 32 processes the thermal data to monitor the temperature of the spin chuck 14. In some cases, controller 32 may be an FT average/uniformity controller (for a coat process) or a CD average/uniformity controller (for a develop process), which uses the spin chuck temperature as an input variable for feedback or feedforward process control. For example, because the spin chuck 14 is smaller than the wafer, thermal differences are often induced across wafer, due to contact area differences with a thermal sink. By supplying the spin chuck temperature to an FT or CD uniformity controller, the across wafer thermal differences can be mitigated.

In other cases, the spin chuck temperature provided to controller 32 could be used for fault detection monitoring. Fault detection monitoring could include, but is not limited to, early diagnosis of spin motor failures, detecting liquids on the spin chuck 14, or identifying a worn or damaged spin chuck 14. For example, an impending spin motor failure may be predicted by detecting an increasing thermal trend in spin chuck temperature (which may occur, e.g., as friction increases in the spin motor due to bearing or grease issue). In addition, liquids on the spin chuck 14 (and/or sub assembly area) may be detected by observing a temperature difference (e.g., due to an evaporative cooling effect of a liquid) on the spin chuck 14 relative to the rest of assembly. Finally, worn or damaged spin chucks can be identified by monitoring a temperature in the spin chuck area of the wafer during wafer processing and analyzing the spin chuck thermal pattern induced across the wafer.

In a fourth application of the embodiment shown in FIG. 1, the thermal imaging sensor 30 may be used in a coating module to monitor the temperature of the cup (CP). The temperature of the cup (CP) isn't typically monitored or controlled, but has been found to have an impact on edge coat uniformity for some films. By positioning the thermal imaging sensor 30, such that the FOV of the sensor encompasses the cup (CP), the temperature of the cup can be monitored for fault detection monitoring and/or process control.

In the fourth application of the embodiment shown in FIG. 1, the thermal imaging sensor 30 collects thermal data from the cup (e.g., right before wafer delivery), and the controller 32 processes the thermal data to monitor the temperature of the cup (CP). In some cases, controller 32 may be an FT uniformity controller, which uses the cup temperature as an input variable for feedback or feedforward process control. For example, the cup temperature could be used by the FT uniformity controller to alter a number of potential control knobs to mitigate effect of differences in cup temperature. In other cases, the cup temperature provided to controller 32 could be used for fault detection monitoring. Fault detection monitoring could include, but is not limited to, discerning chemical drop issues (e.g., when chemicals drop onto the cup during arm movement), discerning cup type differences, and discerning chemical residue buildup in the cup.

In a fifth application of the embodiment shown in FIG. 1, the thermal imaging sensor 30 may be used in a develop module to monitor the temperature of a develop puddle and to understand the through time thermal profile of the develop puddle process by position. The temperature of the develop puddle is affected by many things including, but not limited to, chuck temperature, chemical temperature, incoming wafer temperature, and air temperature. Development rate is also significantly temperature dependent, so the ability to monitor through time (as well as accumulated) thermal profile of the develop puddle process by position can be used to optimize or control the develop process. By positioning the thermal imaging sensor 30, such that the FOV of the sensor encompasses the wafer surface, the temperature of the develop puddle can be monitored for feedback and/or feedforward process control.

In the fifth application of the embodiment shown in FIG. 1, the thermal imaging sensor 30 collects thermal data from the wafer surface during the develop puddle process, and the controller 32 processes the thermal data to monitor the temperature of the develop puddle. In some cases, controller 32 may process the thermal data to determine an average accumulated temperature of the develop puddle, which can be used for feedback and/or feedforward process control. For example, the average accumulated temperature of the develop puddle can be fed back to another controller to alter one or more process parameters (e.g., develop time, temperature or dispense conditions) used during puddle formation. In one example of feedforward control, the average accumulated temperature of the develop puddle could be used to dispense additional thermally controlled develop solution in a local region of the wafer to improve thermal uniformity of the puddle. In another example of feedforward control, local thermal heating methods (e.g., absorption-based heating methods) can be employed to get to a more uniform across wafer (puddle) accumulated temperature.

In a sixth application of the embodiment shown in FIG. 1, the thermal imaging sensor 30 may be used in a variety of liquid dispense modules to monitor the temperature of endothermic or exothermic chemical reactions on a wafer, and to understand the through time thermal profile of single wafer endothermic or exothermic chemical reactions by position (e.g. for cleans). The dynamic temperature of the wafer/chemical is affected by many things including, but not limited to, the method and process of chemical dispense, local concentrations of reactive chemicals, chuck temperature, chemical temperature, incoming wafer temperature, and air temperature. Chemical reaction rate is also significantly temperature dependent, so the ability to monitor through time (as well as accumulated) thermal profile of single wafer endothermic or exothermic chemical reactions by position can be used to optimize or control the chemical process. By positioning the thermal imaging sensor 30, such that the FOV of the sensor encompasses the wafer surface, the temperature of the wafer/chemical reaction can be monitored for feedback and/or feedforward process control.

In the sixth application of the embodiment shown in FIG. 1, the thermal imaging sensor 30 collects thermal data from the wafer surface during wafer processing, and the controller 32 processes the thermal data to monitor the temperature of a chemical reaction occurring on the wafer. In some cases, controller 32 may process the thermal data to determine a local or average accumulated temperature of the wafer, which can be used for feedback and/or feedforward process control. For example, the local or average accumulated temperature of the wafer can be fed back to another controller to alter one or more process parameters (e.g., a chemical reaction process time, temperature, concentration, or mixture ratio) used during wafer processing. In one example of feedforward control, the local or average accumulated temperature of the wafer could be used to dispense additional reactive chemical in a local region of the wafer to increase chemical reactivity in the local area. In another example of feedforward control, local thermal heating methods (e.g., absorption-based heating methods) can be employed to get to a more uniform across wafer accumulated temperature.

In a seventh application of the embodiment shown in FIG. 1, the thermal imaging sensor 30 may be used in a back side scrubber module to monitor the temperature of wafer to understand the wafer conditions associated with the back side scrubber process and/or to understand conditions of the back side scrubber brush. The back side scrubber brush heats wafers locally due to friction induced by brushing. By positioning the thermal imaging sensor 30, such that the FOV of the sensor encompasses the wafer surface, the local heating induced on the wafer by the back side scrubber process can be monitored.

In the seventh application of the embodiment shown in FIG. 1, the thermal imaging sensor 30 collects thermal data from the wafer surface during the back side scrubber process, and the controller 32 processes the thermal data to monitor the temperature of the wafer during the back side scrubber process. In some cases, controller 32 may use the wafer temperature monitored during the back side scrubber process as a metric of extent of defect mitigation. For example, as defects are removed, friction induced by brushing is reduced, which causes the local heating associated with such friction to be reduced. In some cases, controller 32 may monitor the average heating induced from wafer to wafer as a metric of brush lifetime. As the brush wears down, it induces less frictional heating, which should be observable in the wafer to wafer signal. By monitoring the average heating induced from wafer to wafer, controller 32 may predict the end-of-life of the back side scrubber brush.

In the embodiment shown in FIG. 1, thermal imaging sensor 30 is positioned on or near the ceiling of liquid dispense module 10 to monitor a temperature of a substrate disposed within the liquid dispense module, a process step or chemical reaction occurring within the liquid dispense module, or a component included within the liquid dispense module. It is recognized, however, that the thermal imaging sensor 30 is not strictly limited to the placement shown in FIG. 1 or the temperature monitoring and control techniques described above.

Figure 2:
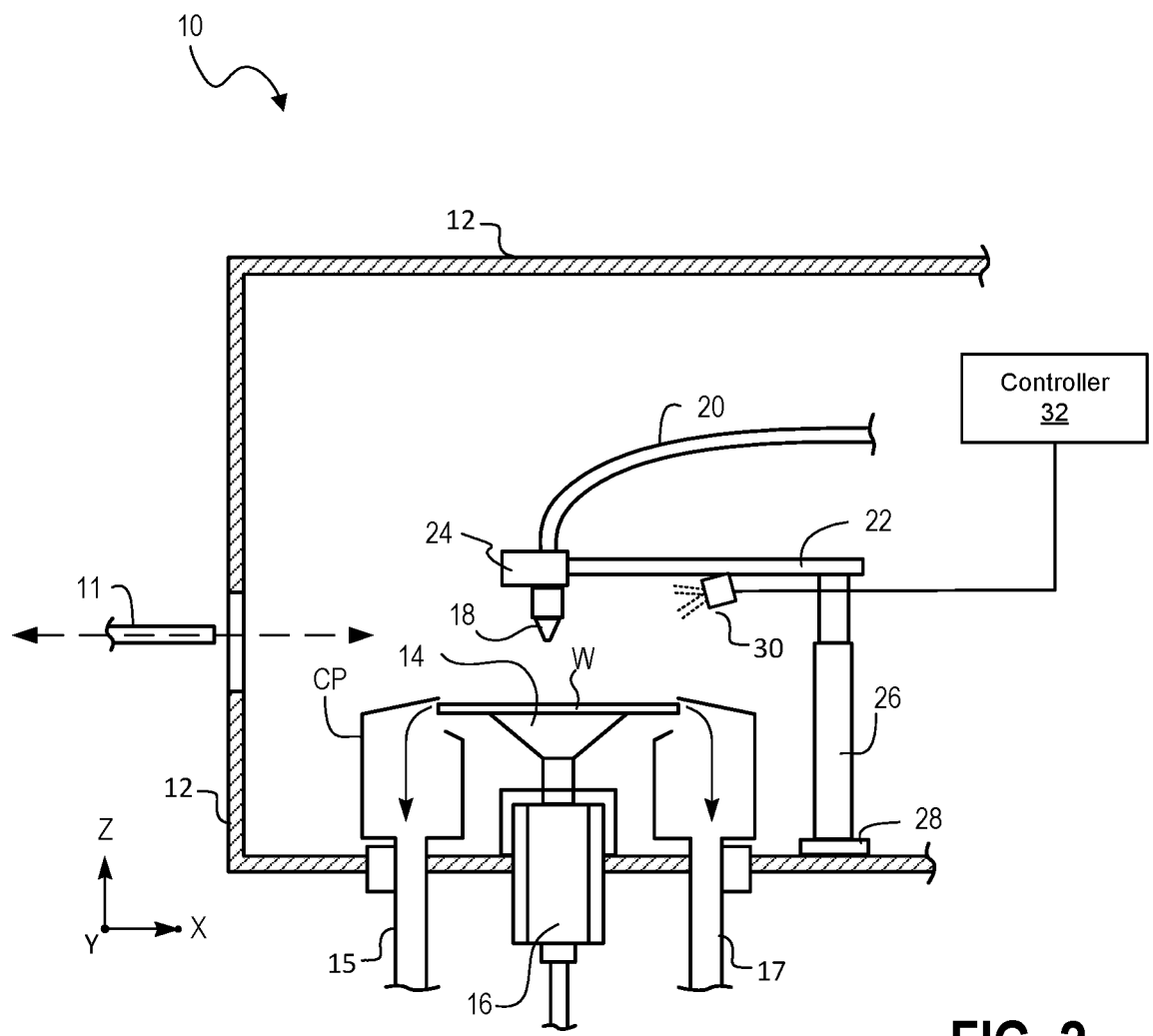
FIG. 2 is a side view of a liquid dispense module in which a thermal imaging sensor is mounted onto a dispense arm assembly to monitor a temperature of the dispense arm assembly or the liquid dispensed by the dispense arm assembly.

FIG. 2 illustrates another embodiment of a liquid dispense module 10 (e.g., a coating module, a developing module, a spin coating module, etc.) within which the thermal monitoring techniques described herein may be applied. In some embodiments, a thermal imaging sensor 30 may be mounted onto the nozzle scan arm 22 (as shown in FIG. 2), or may be coupled to a sidewall of the liquid dispense module 10, so that a field of view (FOV) of the thermal imaging sensor 30 encompasses the nozzle 18 and/or a liquid dispensed by the nozzle 18. This enables the thermal imaging sensor 30 and controller 32 to monitor the temperature of nozzle 18, or a liquid dispensed by the nozzle.

The arrangement shown in FIG. 2 allows the point of use (POU) temperature of the dispensed liquid (i.e., the temperature of the liquid at the nozzle 18 as it is being dispensed onto the wafer) and the dispense nozzle condition (e.g., the suckback height) to be easily discerned. In some cases, the POU temperature monitored by thermal imaging sensor 30 and controller 32 may be suppled to an FT average or uniformity controller (for a coat process) or a CD average or uniformity controllers (for a develop process) as an input variable for feedback or feedforward process control. In other cases, the dispense nozzle condition (e.g., suckback height) can be easily discerned via the thermal monitoring provided by thermal imaging sensor 30 and controller 32, since the position of the liquid in the nozzle 18 will be seen as a thermal difference relative to the air below the liquid position.

Second Embodiment—a Thermal Imaging Sensor Incorporated within a Bake Module

Figure 3:
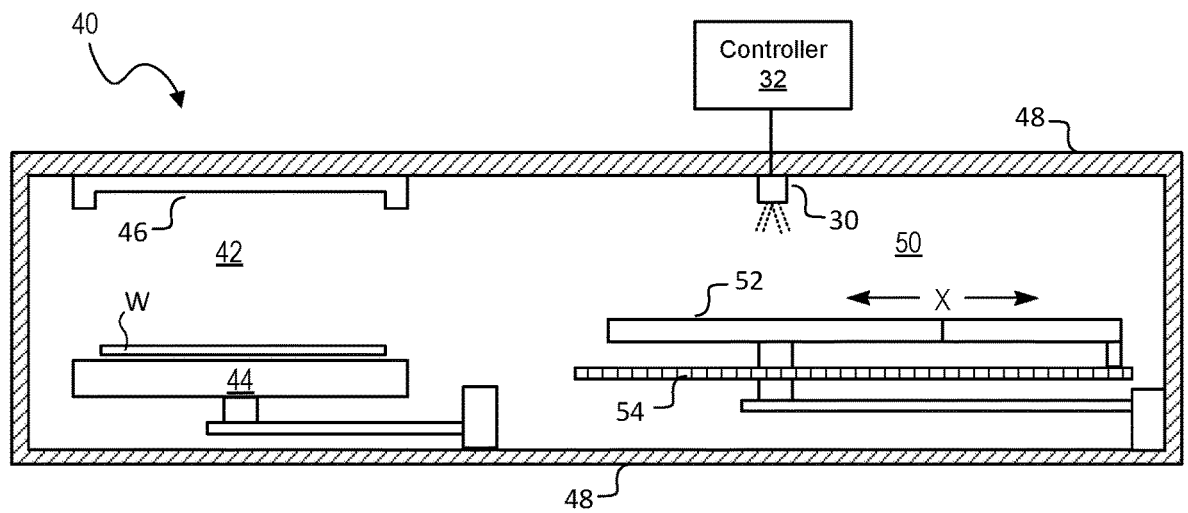
FIG. 3 is a side view a combined bake module in which a thermal imaging sensor is included to monitor a temperature of a cooling arm used to transfer substrates from a baking chamber to a cooling chamber.

FIG. 3 illustrates an exemplary combined bake module 40, which may be configured to perform both a bake process and a cooling process. It is recognized that the combined bake module 40 shown in FIG. 3 is merely one example of a substrate processing module within which the thermal monitoring and control techniques described herein may be applied. Thus, the techniques disclosed herein may be applied to other bake modules and/or other processing modules.

The combined bake module 40 shown in FIG. 3 includes a bake chamber 42 and a cooling chamber 50, which are disposed within and bounded by one or more exterior walls 48. The bake chamber 42 shown in FIG. 3 includes a bake plate 44 and a bake chamber lid 46 forming a portion of the bake chamber 42. One or more heaters (not shown) can be embedded within the bake plate 44 to generate heat, which is used to thermally treat (or bake) a substrate mounted onto an upper surface of the bake plate 44. In addition, one or more temperature sensors (not shown) can be embedded within the bake plate 44 to measure the temperature of the bake plate 44. In some embodiments, the bake plate 44 may include a plurality of through-holes through which lift pins (not shown) can be inserted and used to lift a substrate (e.g., wafer W) off, or lower the substrate onto, the upper surface of the bake plate 44.

A number of different bake processes (such as, e.g., a post exposure bake, a post develop bake, a post apply bake, electrostatic post exposure bake) may be performed within the bake chamber 42 of the combined bake module 40 to thermally treat (or bake) one or more layers or films that were previously applied or deposited onto a substrate (such as wafer W). Typical layers or films include, but are not limited to, topcoat (TC) barrier layers, topcoat antireflective (TARC) layers, bottom antireflective (BARC) layers, imaging layers (e.g., photoresist) and sacrificial and barrier layers (hard mask) for etch stopping. After the substrate is thermally treated, a cooling arm 52 may retrieve the substrate from the upper surface of bake plate 44 and transport the substrate to the cooling chamber 50 to perform a cooling process.

The cooling chamber 50 shown in FIG. 3 includes a cooling arm 52, which is configured to retrieve a substrate from the upper surface of bake plate 44 and transport the substrate to cooling chamber 50. In some embodiments, cooling arm 52 may be coupled to a linear guide 54, which enables the cooling arm to move in a linear direction (e.g., the X-direction) for substrate retrieval and transport. The cooling chamber 50 and/or the cooling arm 52 may perform a cooling process for a substrate that has been thermally treated or baked within bake chamber 42.

Cooling may be performed in a variety of different ways. In some embodiments, cooling arm 52 may include a cooling mechanism (not shown) for lowering the temperature of the wafer. For example, the cooling arm 52 may have process cooling water flowing through it to draw heat away from the wafer. In other embodiments, cooling may be achieved through active temperature controlled (Peltier) cool plates. These cool plates may be provided as independent units.

Figure 4:
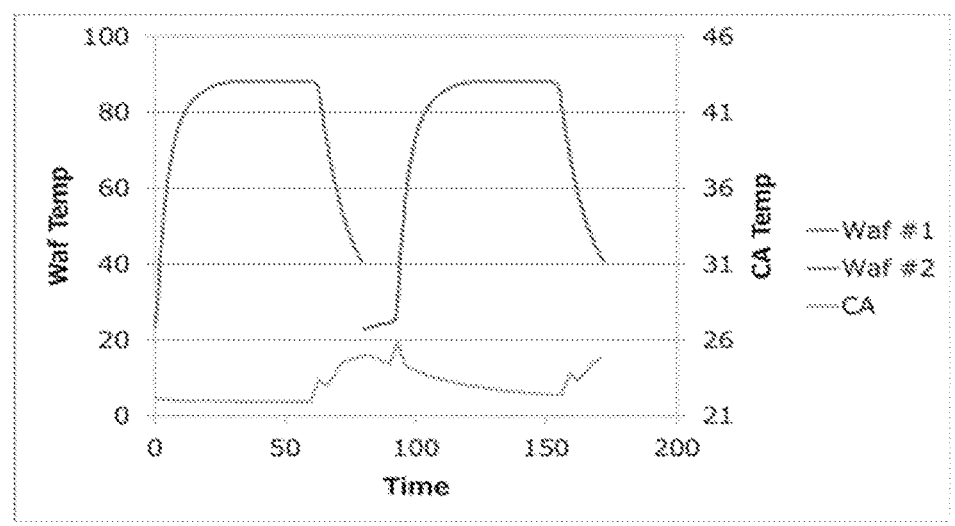
FIG. 4 is a graph depicting the heat retained within a cooling arm when transferring substrates from a baking chamber to a cooling chamber.

Due to throughput constraints of the substrate processing system, only a limited amount of time may be allowed for the cooling process. As such, there is often heat retention within the cooling arm 52 from a prior wafer cooling process (especially when operating in full high volume manufacturing), which affects the thermal history of the next wafer processed in the combined bake module 40 (see, e.g., FIG. 4).

To overcome this problem, a thermal imaging sensor 30 is incorporated with combined bake module 40 to monitor a temperature of the cooling arm 52. In some embodiments, the thermal imaging sensor 30 may be coupled to a ceiling of the combined bake module 40 (as shown, e.g., in FIG. 3), or near the ceiling on a sidewall of the combined bake module 40, so that a field of view (FOV) of the thermal imaging sensor 30 encompasses the cooling arm 52.

Although the thermal imaging sensor 30 is positioned within the cooling chamber 50, it is recognized that the sensor could be arranged elsewhere within the combined bake module, as long as the sensor FOV encompasses the cooling arm 52. For example, the thermal imaging sensor 30 could be positioned within bake chamber 42, instead of the cooling chamber 50. Instead of a combined bake module 40, as shown in FIG. 3, the thermal imaging sensor 30 may be incorporated within a bake module that includes a bake chamber, but does not include a cooling chamber. In such embodiments, the thermal imaging sensor may be positioned on or near a ceiling of the bake module, so that the sensor FOV encompasses an arm (which can be a traditional arm or alternatively a cooling arm), which is configured to retrieve the substrate from the bake chamber.

In the second embodiment shown in FIG. 3, the thermal imaging sensor 30 collects thermal data from the cooling arm 52 before, during or after wafer transport, and the controller 32 processes the thermal data to monitor the temperature of the cooling arm 52. In some cases, controller 32 may utilize the cooling arm temperature for feedforward or feedback process control. For example, having precise knowledge of the cooling arm temperature and/or the wafer temperature at a comparable moment in the combined bake module 40 wafer processing history (e.g., as cooling arm begins transfers to the bake process), may enable controller 32 to adjust the bake profile (e.g., ramp rate, steady state temperature, or steady state time) to ensure that a subsequently processed wafer sees a comparable total accumulated thermal history, regardless of the temperature of the cooling arm 52 at the beginning of that wafer's cooling process.

Third Embodiment—a Thermal Imaging Sensor Incorporated within an Interface Block (IFB)

Figure 5:
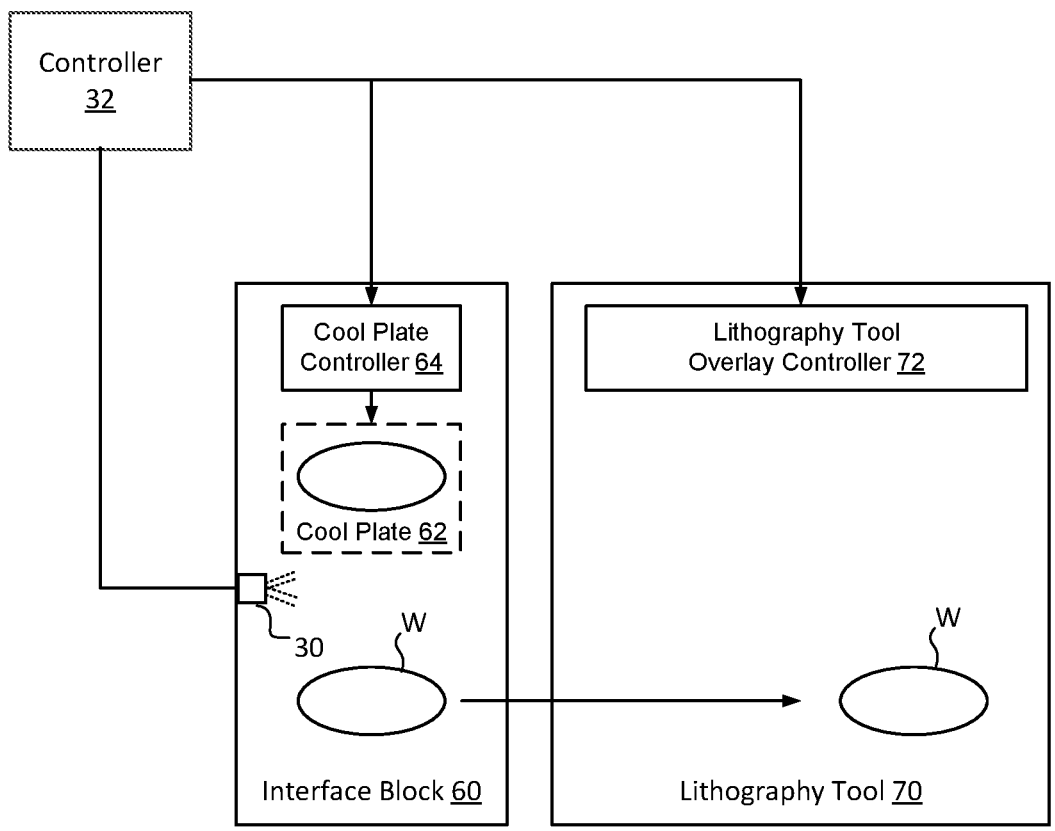
FIG. 5 is a block diagram of an interface block (IFB) and lithography tool in which a thermal imaging sensor is included to monitor a temperature of the IFB or a substrate disposed within the IFB.

FIG. 5 illustrates an exemplary interface block (IFB) 60, which may be used to transfer substrates to other processing modules, such as for example lithography tool 70. It is recognized that the interface block 60 shown in FIG. 5 is merely one example of a substrate processing module within which the thermal monitoring and control techniques described herein may be applied. Thus, the techniques disclosed herein may be applied to other interface blocks and/or other processing modules. The interface block (IFB) 60 may include an interface cool plate 62 such as shown in FIG. 5.

In the third embodiment shown in FIG. 5, the thermal imaging sensor 30 may be used in the interface block (IFB) 60 to monitor the temperature of the IFB 60 or substrates (e.g., wafers, W) disposed within the IFB. The temperature of the IFB isn't typically monitored or controlled, but has been found to have an impact on lithography tool overlay control. By positioning the thermal imaging sensor 30 within the IFB 60, the temperature of the IFB 60 or substrates disposed within the IFB can be monitored for feedback and/or feedforward process control.

In the third embodiment shown in FIG. 5, the thermal imaging sensor 30 collects thermal data from the IFB, or a substrate disposed within the IFB, before the substrate is transported to the lithography tool 70, and the controller 32 processes the thermal data to monitor the temperature of the IFB 60 or the substrate. In some cases, controller 32 may utilize the IFB temperature for feedback process control. For example, controller 32 may provide the IFB temperature to a cool plate controller 64 to adjust the temperature of the cool plate 62, or the cooling time associated with the current cooling process, before the substrate is transported to the lithography tool 70. Such feedback process control may be used to account for thermal differences in IFB temperature through time.

In other cases, controller 32 may utilize the substrate temperature for feedforward process control. For example, controller 32 may provide the substrate temperature to a lithography tool overlay controller 72 at the moment of IFB/lithography tool exchange. Such feedforward process control may allow for the lithography tool 70 to account and/or correct for the actual substrate temperature, and thus, account for unforeseen delays in IFB/lithography tool exchange which would negate any thermal repeatability induced by the last cooling process.

Fourth Embodiment—a Thermal Imaging Sensor Incorporated within a Wafer Inspection System (WIS)

Figure 6:
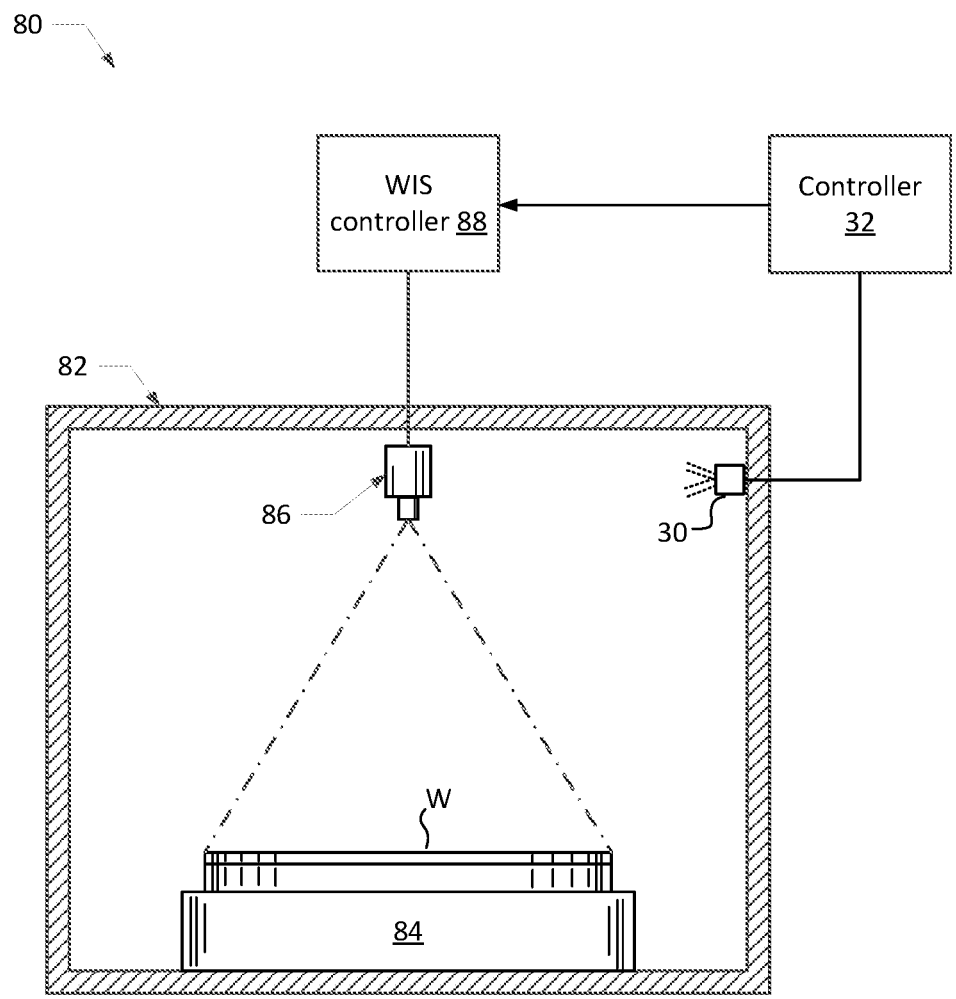
FIG. 6 is a side view of a wafer inspection system (WIS) in which a thermal imaging sensor is included to monitor a temperature of one or more WIS components.

FIG. 6 illustrates an exemplary wafer inspection system (WIS) module 80, which may be configured to perform an inspection process for a substrate (or wafer). In some embodiments, WIS module 80 may be integrated within a substrate processing system for inspecting substrates as they are processed within the substrate processing system. In other embodiments, WIS module 80 may be a stand-alone module located outside of a substrate processing system. It is recognized that the WIS module 80 shown in FIG. 6 is merely one example of a substrate processing module within which the thermal monitoring and control techniques described herein may be applied. Thus, the techniques disclosed herein may be applied to other inspection modules and/or other processing modules.

Wafer inspection system (WIS) modules are often used to inspect a substrate (such as a semiconductor wafer) during or after one or more processing steps (e.g., a coating process, a bake process, a develop process, etc.) are performed within a substrate processing system. For example, a WIS module may determine a film thickness (FT) of a layer applied to a surface of a wafer after the wafer is subject to a bake process to cure or harden the layer. In another example, a WIS module may determine a critical dimension (CD) of a structure formed on the wafer after the wafer is developed to form the structure.

As shown in FIG. 6, WIS module 80 is bounded by an outer wall 82 and includes a support structure 84 for supporting a substrate (e.g., a wafer, W), while the substrate is disposed within the WIS module for inspection. Camera system 86 is disposed within the WIS module 80 for obtaining images of the substrate. In some embodiments, camera system 86 may be coupled to an inner surface of outer wall 82 and centered above the substrate, as shown in FIG. 6, so that a field of view (FOV) of camera system 86 captures the entire upper surface of the substrate. It will be recognized, however, that the camera position shown in FIG. 6 is merely one example, and that camera system 86 may be alternatively positioned within the WIS module 80, in other embodiments. Further, mirrors or other optics may be utilized to direct an image to a camera system that may be located elsewhere to the WIS module. For example, a mirror could be located at the position of the camera of FIG. 6 to direct the image on a camera that is located in a plane parallel to the plane of the substrate of FIG. 6.

Camera system 86 may generally include a light source (or lamp) and a photoreceptive sensor (or camera). It is noted, however, that a wide variety of camera systems may be utilized, including but not limited to, charged coupled device (CCD) image sensor cameras, complementary metal oxide semiconductor (CMOS) image sensor cameras, N-type metal-oxide-semiconductor (NMOS) image sensor cameras, indium gallium arsenide (InGaAs) image sensor cameras, indium antimony (InSb) image sensor cameras, etc.

The light source included within camera system 86 may typically be a light source of the visible spectrum or longer. For example, light sources in the visible spectrum, near-infrared (NIR), shortwave-infrared (SWIR) and mid-infrared (MIR) represent exemplary light sources that may be used within camera system 86 to illuminate a surface of the substrate.

The photoreceptive sensor (e.g., CCD, CMOS, NMOS, etc.) of camera system 86 detects light reflected from the surface of the substrate and converts the detected light into a line scan or matrix of raw red, green, and blue (RGB) values. The RGB values output from camera system 86 are provided to the WIS controller 88 for further processing. In some embodiments, WIS controller 88 may apply a common model to the RGB values to convert color differences detected on the substrate to a film thickness (FT) or critical dimension (CD) value.

In some cases, the RGB values provided by the camera system 86 to the WIS controller 88 may be dependent on, or influenced by, the temperature of one or more of the camera system 86 components (e.g., the light source, photoreceptive sensor), among other things. Due to this temperature dependency, the color or color differences detected by the camera system 86 on the substrate may be erroneously interpreted as an FT or CD value or difference.

To overcome this problem, a thermal imaging sensor 30 is included within WIS module 80 to monitor the temperature of the camera system 86 components and/or the temperature of the substrate disposed within the WIS module 80. The temperature within the WIS module isn't typically monitored or controlled, but has been found to affect the color or color differences detected by the camera system 86 on the substrate.

In some embodiments, the thermal imaging sensor 30 may be coupled to a ceiling or an inner sidewall of the WIS module 80 (as shown, e.g., in FIG. 3), so that a field of view (FOV) of the thermal imaging sensor 30 encompasses the camera system 86. In some embodiments, the thermal imaging sensor 30 may be additionally or alternatively positioned, so that the sensor FOV encompasses the substrate. By positioning the thermal imaging sensor 30 within the WIS module 80, so that the sensor FOV encompasses the camera system 86 and/or the substrate, the temperature of the camera system 86 components and/or the substrate can be monitored and used for WIS calibration purposes.

In the fourth embodiment shown in FIG. 6, the thermal imaging sensor 30 collects thermal data from the camera system 86 components or a substrate disposed within the WIS module 80 during the inspection process, and controller 32 processes the thermal data to monitor a temperature of the camera system 86 components and/or a temperature of the substrate. In some embodiments, controller 32 may provide the temperature of the camera system 86 components and/or the temperature of the substrate directly to the WIS controller 88. In other embodiments, controller 32 may process the thermal data to determine a correction value (e.g., lamp temperature correction value, a camera temperature correction value, a substrate temperature correction value, etc.), which can be provided to the WIS controller 88. WIS controller 88 may use the temperature or the correction value provided by controller 32 to adjust the RGB values supplied by camera system 86. In doing so, the WIS controller 88 may calibrate the FT/CD values generated by the WIS controller 88 to account for variations in camera system 86 component or substrate temperature.

Figure 7:
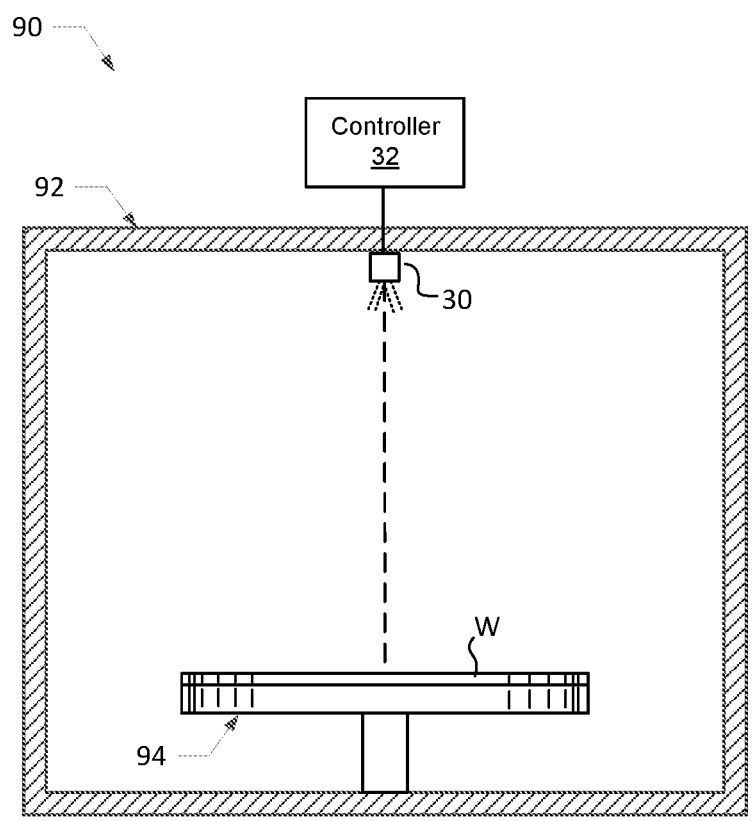
FIG. 7 is a side view of a substrate processing module in which a thermal imaging sensor is coupled to the module ceiling.

Fifth Embodiment—a Thermal Imaging Sensor Incorporated within a Substrate Processing Module FIG. 7 illustrates a generic substrate processing module 90, which may be configured to perform a process (e.g., a coating process, a develop process, a bake process, an exposure process, a cooling process, a plating process, a deposition process, an etch process, or any of a wide variety of substrate processing processes, etc.). It is recognized that the generic substrate processing module 90 shown in FIG. 7 is merely one example of a substrate processing module within which the thermal monitoring techniques described herein may be applied.

The generic substrate processing module 90 shown in FIG. 7 is bounded by an outer wall 92 and includes a support structure 94 for supporting a substrate (e.g., a wafer, W), while the substrate is disposed within the processing module. Depending on the processing performed within the substrate processing module 90, the support structure 94 may be a spin chuck, a heat plate, a cooling plate, etch chuck, deposition chuck, etc.

In the fifth embodiment shown in FIG. 7, a thermal imaging sensor 30 is incorporated within the substrate processing module 90 and coupled to the module ceiling, such that the thermal imaging sensor 30 is parallel to the plane of substrate (or wafer, W) and centered above the center of the substrate. Thermal radiation reflects off of most surfaces. By positioning the thermal imaging sensor 30 as shown in FIG. 7, the thermal imaging sensor 30 can observe the thermal radiation reflected from the surface of the substrate to detect elevational variations in the substrate surface.

Figure 8A:
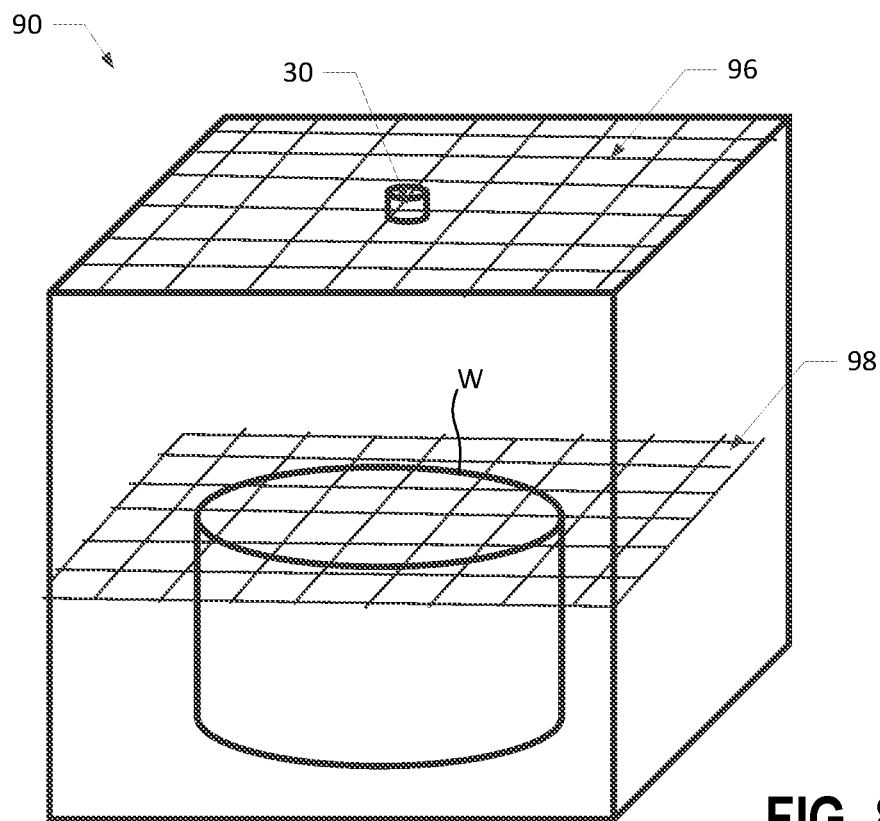
FIG. 8A is a front perspective view of the substrate processing system shown in FIG. 7 illustrating how the thermal imaging sensor may be arranged to obtain a two-dimensional (2D) thermal grid image of the substrate surface.
Figure 8B:
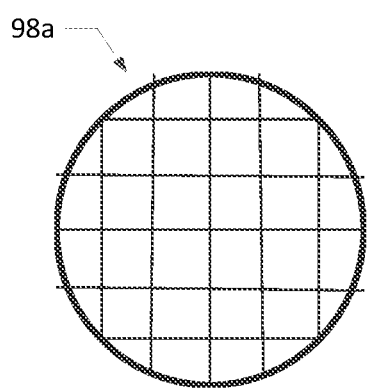
FIG. 8B is a top view of 2D thermal grid image of a substantially flat substrate surface.
Figure 8C:
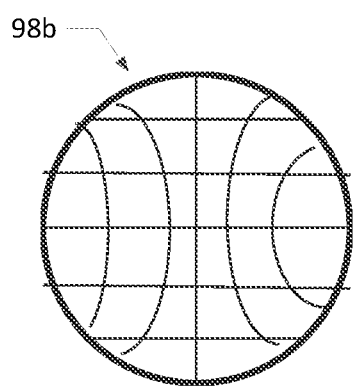
FIG. 8C is a top view of 2D thermal grid image of a substrate surface that is not flat.

FIGS. 8A-C are conceptual diagrams that may be used to explain how the thermal imaging sensor 30 shown in FIG. 7 can be used to detect elevational variations in the substrate surface. As shown in FIG. 8A, for example, a thermal grid 96 can be created in the same plane as the thermal imaging sensor 30, or a parallel plane to the thermal imaging sensor, such that the thermal grid is parallel to the plane of the upper surface of the substrate. The temperature of the thermal grid 96 may be any temperature, which differs from the ambient temperature within the substrate processing module 90. The thermal radiation produced by the thermal grid 96 is reflected from the surface of the substrate (W) and collected by the thermal imaging sensor 30 as a thermal reflection grid 98.

By creating a thermal grid 96 (whose temperature is discernable from the ambient temperature) that is planar to an upper surface of the substrate, the thermal imaging sensor 30 and controller 32 can observe the nature of the deformation of this grid when the substrate surface is not flat. FIG. 8B illustrates an example thermal reflection grid 98 that may be observed from a flat substrate surface. FIG. 8C illustrates an example thermal reflection grid 98 that demonstrates how the thermal grid 96 may be deformed in the reflection grid image when the surface of the substrate is not flat. Coarse wafer shape can be extracted based on the deformation of the thermal grid 96 observed by the thermal imaging sensor 30.

Sixth Embodiment—a Thermal Imaging Sensor Incorporated within a Plating Dispense Module In a sixth embodiment, a thermal imaging sensor 30 may be incorporated within a plating dispense module to monitor the significantly elevated temperature (e.g., ~55C) of the dispensed plating chemical, the substrate temperature in response to the dispensed plating chemical, the temperature of the in-situ heater and/or substrate temperature changes induced by the in-situ heater. In one technique, the plating dispense module is an electroless plating module. By positioning the thermal imaging sensor 30, such that the sensor FOV encompasses the plating chemical dispense assembly, the in-situ heater and/or the substrate, the thermal data collected by the thermal imaging sensor 30 can be used for fault detection monitoring as well as process control.

In the sixth embodiment, the thermal imaging sensor 30 collects thermal data from the plating chemical dispense assembly, the in-situ heater and/or the substrate, and the controller 32 processes the thermal data to monitor the temperature of the dispensed plating chemical, substrate temperature changes induced by the dispensed plating chemical, the in-situ heater temperature, or the substrate temperature changes induced by the in-situ heater. Given the nature of the electroless plating module, for wafer temperature monitoring during the in-situ heater process, thermal imaging sensor 30 may collect the thermal data from underneath the substrate, in some embodiments.

In some cases, the dispensed plating chemical temperature, substrate temperature changes induced by the dispensed plating chemical, in-situ heater temperature, or substrate temperature changes induced by the in-situ heater detected by thermal imaging sensor 30 may be supplied to controller 32 and used as input variable(s) for fault detection monitoring and/or process control. For example, controller 32 may be a plating process controller associated with average plating amount. When implemented as a plating processing controller, controller 32 may use the dispensed plating chemical temperature, substrate temperature changes induced by the dispensed plating chemical, in-situ heater temperature, or substrate temperature changes induced by the in-situ heater as input variable(s) in a feedback or feedforward control process.

In some cases, controller 32 may be an across wafer plating uniformity controller. When implemented as an across wafer plating uniformity controller, controller 32 may use the dispensed plating chemical temperature, substrate temperature changes induced by the dispensed plating chemical, in-situ heater temperature, or substrate temperature changes induced by the in-situ heater as input variable(s) in a feedback or feedforward control to alter a number of potential control knobs to mitigate effect of across wafer differences.

In other cases, the thermal data processed by controller 32 could be used for fault detection monitoring. Fault detection monitoring could include, but is not limited to, early diagnosis of thermal controller drifts/failures and poor/incomplete puddle formation. For example, incomplete puddle formation may show up as a discernable thermal difference between the plating puddle's covered substrate area versus the areas without puddle coverage (temperature of underlying substrate).

It is noted that the controller(s) described herein can be implemented in a wide variety of manners. In one example, the controller 32 shown in FIGS. 1-3 and 5-7 may be a computer. In another example, controller 32 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality described herein for controller 32. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

It will be recognized that the method embodiments disclosed herein may be utilized before, during or after a wide range of substrates have been processed in a processing module, such as a liquid dispense module, a baking module (or a combined bake module), a WIS module, an IFB, a plating dispense module or another processing module. The substrate may be any substrate for which the patterning of the substrate is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps that yield a wide variety of structures and layers, all of which are known in the substrate processing art, and which may be considered to be part of the substrate. For example, in one embodiment, the substrate may be a semiconductor wafer having one or more semiconductor processing layers formed thereon.

Example embodiments of the invention are summarized here. Other embodiments can also be understood from the entirety of the specification as well as the claims filed herein.

Example 1. A system includes at least one processing module for processing a substrate; a thermal imaging sensor positioned within the at least one processing module to obtain thermal data from the substrate, a liquid dispensed onto the substrate, or a component included within the at least one processing module; and a controller coupled to receive the thermal data from the thermal imaging sensor and configured to process the thermal data for fault detection monitoring, process control, substrate evaluation, equipment evaluation, process evaluation, or end-of-life prediction.

Example 2. The system of example 1, where the at least one processing module is a liquid dispense module, and where the thermal imaging sensor is positioned on or near a ceiling of the liquid dispense module, such that a field of view (FOV) of the thermal imaging sensor encompasses the substrate and/or one or more surrounding components.

Example 3. The system of one of examples 1 or 2, where the thermal imaging sensor obtains the thermal data from a surface of the substrate, and where the controller processes the thermal data to monitor an evaporative cooling effect of solvent evaporation from the surface of the substrate.

Example 4. The system of one of examples 1 to 3, where the controller processes the thermal data to: detect waferto-wafer evaporative cooling differences, which are used for fault detection monitoring; or detect module-to-module evaporative cooling differences, which are used to optimize one or more processing parameters of the at least one processing module; or detect a metric associated with an end point of the solvent evaporation, where the metric is used as a process end point metric to end a current processing step and proceed to a next processing step.

Example 5. The system of one of examples 1 to 4, where the thermal imaging sensor obtains the thermal data from a surface of the substrate, and where the controller processes the thermal data to monitor a temperature of a liquid dispensed onto the substrate and/or a temperature change induced on the substrate by the liquid.

Example 6. The system of one of examples 1 to 5, where the controller processes the thermal data to: determine an average temperature of the liquid and/or an average temperature change induced on the substrate by the liquid, which are/is used for feedback or feedforward process control; or determine an across wafer temperature difference of the liquid and/or an across wafer temperature difference induced on the substrate by the liquid, which are/is used for feedback or feedforward process control.

Example 7. The system of one of examples 1 to 6, where the controller processes the thermal data to: detect thermal controller drifts or failures; or detect poor or incomplete puddle formation.

Example 8. The system of one of examples 1 to 7, where the thermal imaging sensor obtains the thermal data from a spin chuck included within the liquid dispense module, and where the controller processes the thermal data to monitor a temperature of the spin chuck.

Example 9. The system of one of examples 1 to 8, where the controller uses the temperature of the spin chuck as an input variable for feedback or feedforward process control.

Example 10. The system of one of examples 1 to 9, where the controller uses the temperature of the spin chuck to predict an impending spin motor failure, detect a liquid on the spin chuck, or identify a worn or damaged spin chuck.

Example 11. The system of one of examples 1 to 10, where the thermal imaging sensor obtains the thermal data from a cup included within the liquid dispense module, and where the controller processes the thermal data to monitor a temperature of the cup.

Example 12. The system of one of examples 1 to 11, where the controller uses the temperature of the cup as an input variable for feedback or feedforward process control.

Example 13. The system of one of examples 1 to 12, where the controller uses the temperature of the cup to detect chemical drop issues, cup type differences, or chemical residue buildup in the cup.

Example 14. The system of one of examples 1 to 13, where the thermal imaging sensor collects the thermal data from a surface of the substrate during a develop puddle process, and where the controller processes the thermal data to monitor a temperature of a develop puddle dispensed onto the surface of the substrate.

Example 15. The system of one of examples 1 to 14, where the controller processes the thermal data to determine an average accumulated temperature of the develop puddle, which is used for feedback and/or feedforward process control.

Example 16. The system of one of examples 1 to 15, where the thermal imaging sensor collects the thermal data from a surface of the substrate during substrate processing, and where the controller processes the thermal data to monitor a temperature of a chemical reaction occurring on the substrate.

Example 17. The system of one of examples 1 to 16, where the controller processes the thermal data to determine a local accumulated temperature or an average accumulated temperature of the chemical reaction occurring on the substrate, which is used for feedback and/or feedforward process control.

Example 18. The system of one of examples 1 to 17, where the thermal imaging sensor collects the thermal data from a surface of the substrate during a back side scrubber (BST) process, and where the controller processes the thermal data to monitor a temperature of the substrate during the back side scrubber process.

Example 19. The system of one of examples 1 to 18, where the controller uses the temperature of the substrate as a metric of extent of defect mitigation.

Example 20. The system of one of examples 1 to 19, where the controller uses the temperature of the substrate to monitor an average temperature induced from wafer-to-wafer, and uses the average temperature induced from wafer-to-wafer as a metric of back side scrubber brush lifetime.

Example 21. The system of one of examples 1 to 20, where the at least one processing module is a liquid dispense module, and where the thermal imaging sensor is mounted onto a nozzle scan arm included within the liquid dispense module, or a sidewall of the liquid dispense module, so that a field of view (FOV) of the thermal imaging sensor encompasses a nozzle and/or a liquid dispensed by the nozzle.

Example 22. The system of one of examples 1 to 21, where the thermal imaging sensor collects the thermal data from the nozzle and/or the liquid dispensed by the nozzle, and where the controller processes the thermal data to monitor a temperature of the liquid at the nozzle and/or a position of the liquid in the nozzle.

Example 23. The system of one of examples 1 to 22, where the at least one processing module is a bake module including a bake chamber, and where the thermal imaging sensor is positioned on or near a ceiling of the bake module, so that a field of view (FOV) of the thermal imaging sensor encompasses a cooling arm.

Example 24. The system of one of examples 1 to 23, where the thermal imaging sensor collects the thermal data from the cooling arm before, during or after the substrate is transported, and where the controller processes the thermal data to monitor a temperature of the cooling arm.

Example 25. The system of one of examples 1 to 24, where the controller uses the temperature of the cooling arm for feedback and/or feedforward process control.

Example 26. The system of one of examples 1 to 25, where the at least one processing module is an interface block (IFB).

Example 27. The system of one of examples 1 to 26, where the thermal imaging sensor collects thermal data from the IFB, or a substrate disposed within the IFB, and where the controller processes the thermal data to monitor a temperature of the IFB or a temperature of the substrate.

Example 28. The system of one of examples 1 to 27, where the controller uses the temperature of the IFB for feedback process control by supplying the temperature of the IFB to a cool plate controller included within the IFB, which uses the temperature of the IFB to adjust a temperature of a cool plate included within the IFB, or a cooling time associated with a current cooling process, before the substrate is transported to the lithography tool.

Example 29. The system of one of examples 1 to 28, where the controller uses the temperature of the substrate for feedforward process control by supplying the temperature of the substrate to a lithography tool overlay controller.

Example 30. The system of one of examples 1 to 29, where the at least one processing module is a wafer inspection (WIS) module including a camera system for obtaining images of the substrate during an inspection process, and where the thermal imaging sensor is positioned on a ceiling or a sidewall of the WIS module, so that a field of view (FOV) of the thermal imaging sensor encompasses the camera system and/or the substrate.

Example 31. The system of one of examples 1 to 30, where the thermal imaging sensor collects the thermal data from at least one camera system component and/or from the substrate during the inspection process, and where the controller processes the thermal data to monitor a temperature of the at least one camera system component and/or a temperature of the substrate.

Example 32. The system of one of examples 1 to 31, where the at least one processing module includes a thermal grid planar to an upper surface of the substrate, and where the thermal imaging sensor is positioned on a ceiling of the at least one processing module.

Example 33. The system of one of examples 1 to 32, where thermal radiation produced by the thermal grid is reflected from an upper surface of the substrate and collected by the thermal imaging sensor as a thermal reflection grid, and where the controller determines that the upper surface of the substrate is flat or not flat.

Example 34. The system of one of examples 1 to 33, where the at least one processing module includes an plating dispense module including a plating chemical dispense assembly and a heater, and where the thermal imaging sensor is positioned within the plating dispense module, so that a field of view (FOV) of the thermal imaging sensor encompasses the plating chemical dispense assembly, the heater and/or the substrate.

Example 35. The system of one of examples 1 to 34, where the thermal imaging sensor collects the thermal data from the plating chemical dispense assembly, the heater and/or the substrate, and where the controller processes the thermal data to monitor a temperature of a plating chemical, a temperature change induced on the substrate by the plating chemical, a temperature the heater, or a temperature change induced on the substrate by the heater.

Example 36. The system of one of examples 1 to 35, where the controller uses at least one of the temperature of a plating chemical dispensed by the plating chemical dispense assembly, the temperature change induced on the substrate by the plating chemical, the temperature the heater, or the temperature change induced on the substrate by the heater as an input variable in a feedback or feedforward control process.

Example 37. The system of one of examples 1 to 36, where the controller processes the thermal data to: detect thermal controller drifts or failures; or detect poor or incomplete plating puddle formation.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A system, comprising:
    at least one processing module for processing a substrate;
    a thermal imaging sensor positioned within the at least one processing module to obtain thermal data from the substrate, a liquid dispensed onto the substrate, or a component included within the at least one processing module, wherein the at least one processing module is a liquid dispense module, and wherein the thermal imaging sensor is mounted onto a nozzle scan arm included within the liquid dispense module, wherein the thermal imaging sensor is positioned to have a field of view that includes the substrate or spin chuck; and
    a controller coupled to receive the thermal data from the thermal imaging sensor and configured to process the thermal data for fault detection monitoring, process control, substrate evaluation, equipment evaluation, process evaluation, or end-of-life prediction.

2. The system of claim 1, wherein the thermal imaging sensor obtains the thermal data from a surface of the substrate, and wherein the controller is programmed to process the thermal data to monitor an evaporative cooling effect of solvent evaporation from the surface of the substrate.

3. The system of claim 1, further comprising a non-transitory memory storing programming instructions and coupled to the controller, the programming instructions when executed by the controller cause the controller to process the thermal data to:
    determine an average temperature of the liquid and/or an average temperature change induced on the substrate by the liquid.

4. The system of claim 1, further comprising a non-transitory memory storing a program to be executed by the controller, the program comprising programming instructions to
    determine, based on the thermal data, an across wafer temperature difference of the liquid and/or an across wafer temperature difference induced on the substrate by the liquid.

5. A system comprising:
    at least one processing module for processing a substrate;
    a thermal imaging sensor positioned within the at least one processing module to obtain thermal data from the substrate, a liquid dispensed onto the substrate, or a component included within the at least one processing module, wherein the at least one processing module comprises a liquid dispense module, and wherein the thermal imaging sensor is mounted onto a nozzle scan arm included within the liquid dispense module;
    a controller coupled to receive the thermal data from the thermal imaging sensor and configured to process the thermal data for fault detection monitoring, process control, substrate evaluation, equipment evaluation, process evaluation, or end-of-life prediction; and
    a non-transitory memory storing a program to be executed by the controller, the program comprising programming instructions to process thermal data captured at the thermal imaging sensor to monitor a temperature of a spin chuck within the liquid dispense module.

6. The system of claim 5, wherein the programming instructions further comprise instructions for the controller to generate a feedback or feedforward process control signal based on the temperature of the spin chuck.

7. The system of claim 5, wherein the programming instructions further comprise instructions for the controller to generate a signal indicative of an impending spin motor failure, a liquid on the spin chuck, or a worn or damaged spin chuck based on the temperature of the spin chuck.

8. A system comprising:
at least one processing module for processing a substrate;
a thermal imaging sensor positioned within the at least one processing module to obtain thermal data from the substrate, a liquid dispensed onto the substrate, or a component included within the at least one processing module, wherein the at least one processing module comprises a liquid dispense module, and wherein the thermal imaging sensor is mounted onto a nozzle scan arm included within the liquid dispense module;
a controller coupled to receive the thermal data from the thermal imaging sensor and configured to process the thermal data for fault detection monitoring, process control, substrate evaluation, equipment evaluation, process evaluation, or end-of-life prediction; and
a non-transitory memory storing a program to be executed by the controller, the program comprising programming instructions to process thermal data captured at the thermal imaging sensor from a cup included within the liquid dispense module to monitor a temperature of the cup.

9. The system of claim 8, wherein the programming instructions further comprise instructions for the controller to generate a feedback or feedforward process control signal.

10. The system of claim 8, wherein the programming instructions further comprise instructions for the controller to generate a signal indicative of chemical drop issues, cup type differences, or chemical residue buildup in the cup.

11. The system of claim 1, further comprising a non-transitory memory storing a program to be executed by the controller, the program comprising programming instructions to, based on processing thermal data captured at the thermal imaging sensor, determine a temperature of a develop puddle dispensed onto a surface of the substrate.

12. The system of claim 1, further comprising a non-transitory memory storing a program to be executed by the controller, the program comprising programming instructions to, based on processing thermal data captured at the thermal imaging sensor, determine a temperature of a chemical reaction occurring on the substrate.

13. The system of claim 1, further comprising a non-transitory memory storing a program to be executed by the controller, the program comprising programming instructions to process thermal data captured at the thermal imaging sensor to monitor a temperature of the liquid at the nozzle and/or a position of the liquid in the nozzle.

* * * * *